United States Patent
Prejbeanu

(10) Patent No.: US 9,754,653 B2
(45) Date of Patent: Sep. 5, 2017

(54) THERMALLY ASSISTED MULTI-LEVEL MRAM CELL AND METHOD FOR WRITING A PLURALITY OF BITS IN THE MRAM CELL

(71) Applicant: CROCUS Technology SA, Grenoble (FR)

(72) Inventor: Ioan Lucian Prejbeanu, Seyssinet Pariset (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 14/438,365

(22) PCT Filed: Oct. 11, 2013

(86) PCT No.: PCT/EP2013/071360
§ 371 (c)(1),
(2) Date: Apr. 24, 2015

(87) PCT Pub. No.: WO2014/063939
PCT Pub. Date: May 1, 2014

(65) Prior Publication Data
US 2015/0287450 A1    Oct. 8, 2015

(30) Foreign Application Priority Data

Oct. 25, 2012 (EP) .................... 12290368

(51) Int. Cl.
G11C 11/15    (2006.01)
G11C 11/16    (2006.01)
G11C 11/56    (2006.01)

(52) U.S. Cl.
CPC ........ *G11C 11/1675* (2013.01); *G11C 11/161* (2013.01); *G11C 11/1673* (2013.01); *G11C 11/5607* (2013.01)

(58) Field of Classification Search
CPC ... G11C 11/161; G11C 11/16; G11C 11/1673; G11C 11/1675; G11C 11/5607
(Continued)

(56) References Cited

U.S. PATENT DOCUMENTS 5,640,343 A    6/1997 Gallagher et al.
6,950,335 B2   9/2005 Dieny et al.
(Continued)

FOREIGN PATENT DOCUMENTS

EP    2528060 A1    11/2012

OTHER PUBLICATIONS

International Search Report for PCT/EP2013/071360 dated Jan. 3, 2014.
Written Opinion for PCT/EP2013/071360 dated Dec. 23, 2013.

*Primary Examiner* — Andrew Q Tran
(74) *Attorney, Agent, or Firm* — Pearne & Gordon LLP

(57) ABSTRACT

Method for writing and reading a plurality of data bits to a magnetic random access memory (MRAM) cell including a magnetic tunnel junction including a reference magnetic layer having a reference magnetization, a tunnel barrier layer, and a SAF storage magnetic layer including a first and second storage magnetization being coupled antiparallel through a storage coupling layer and freely orientable at a high temperature threshold. The method includes: heating the magnetic tunnel junction to the high temperature threshold; and applying a write magnetic field to orient the first and second storage magnetization; wherein the high temperature threshold includes one of a first or third high temperature threshold such as to orient the first storage magnetization respectively antiparallel or parallel to the second storage magnetization; or a second high temperature threshold such as
(Continued)

as to orient the first storage magnetization with an angle below 180° with respect to the second storage magnetization.

10 Claims, 5 Drawing Sheets

(58) Field of Classification Search
USPC .......................................... 365/173, 171, 211
See application file for complete search history.

(56) References Cited

U.S. PATENT DOCUMENTS

| | | | | |
|---|---|---|---|---|
| 7,486,551 | B1* | 2/2009 | Li | G11C 11/16 365/158 |
| 7,602,637 | B2* | 10/2009 | Klostermann | G11C 11/16 365/158 |
| 7,746,687 | B2* | 6/2010 | Zheng | G11C 11/5607 365/158 |
| 2010/0080049 | A1 | 4/2010 | Zheng et al. | |
| 2011/0007561 | A1* | 1/2011 | Berger | G11C 11/16 365/171 |
| 2012/0300539 | A1* | 11/2012 | Lombard | G11C 11/161 365/158 |

* cited by examiner

THERMALLY ASSISTED MULTI-LEVEL MRAM CELL AND METHOD FOR WRITING A PLURALITY OF BITS IN THE MRAM CELL

FIELD

The present disclosure concerns method for writing and reading a plurality of data bits to a magnetic random access memory (MRAM) cell.

DESCRIPTION OF RELATED ART

The development of MRAM cells with a magnetic tunnel junction has allowed a significant increase in the performances and operating mode of these MRAMs. Such MRAM cells are described in U.S. Pat. No. 5,640,343. Such MRAM cell typically comprises a magnetic tunnel junction having a tunneling barrier layer between a first ferromagnetic layer and a second ferromagnetic layer. The magnetic tunnel junction is electrically connected at one end to a first current line and, to its other end, to a selection CMOS transistor. The MRAM cell further comprises a second current line disposed orthogonal to the first current line.

MRAM cells with a multilevel state write operation has also been proposed, allowing for writing more than the two level states "0" and "1" as described above. Such a MRAM cell with a multilevel state write operation is disclosed in U.S. Pat. No. 6,950,335. Here, the magnetization of the second ferromagnetic layer, or storage layer, can be oriented in any intermediate direction between the direction parallel and the direction antiparallel to the magnetization direction of the first ferromagnetic layer, or reference layer. Orienting the magnetization of the storage layer in the intermediate directions can be achieved by generating magnetic fields with appropriate relative intensity along the perpendicular directions of the first and second current line.

EP2528060 discloses a method for writing and reading a plurality of data bits to a magnetic random access memory (MRAM) cell comprising a magnetic tunnel junction formed from a read magnetic layer having a read magnetization, a tunnel barrier layer, and a storage layer; the storage layer comprising a first storage ferromagnetic layer having a first storage magnetization, a second storage ferromagnetic layer having a second storage magnetization that can be freely oriented at a high temperature threshold, and a storage anti-parallel coupling layer magnetically coupling the first and second storage magnetization, an antiferromagnetic layer which pins at the functioning temperature the storage layer and a field line; comprising: heating the magnetic tunnel junction over a high temperature threshold; orienting the first and second storage magnetization until the first storage magnetization forms a predetermined angle with respect to the second storage magnetization such as to reach a predetermined resistance state level of the magnetic tunnel junction determined by the orientation of the first storage magnetization relative to the read magnetization; and cooling the magnetic tunnel junction to a low temperature threshold to freeze the second storage magnetization at the predetermined angle.

US2010080049 discloses a method of self-detected writing to a multi-bit (i.e., multilevel) thermally assisted MRAM, which increases a reading margin between data state levels and decreases reading margin variability due to cell resistance variation.

SUMMARY

The present disclosure concerns a MRAM cell comprising a magnetic tunnel junction comprising a reference magnetic layer having a reference magnetization, a tunnel barrier layer, and a storage magnetic layer including a first storage layer having a first storage magnetization, a second storage layer having a second storage magnetization, a storage coupling layer magnetically coupling the first storage magnetization antiparallel with the second storage magnetization, and an antiferromagnetic storage layer pinning, at a low temperature threshold, the storage magnetization of the storage layer being adjacent to the antiferromagnetic storage layer and freeing said storage magnetization at a high temperature threshold. In particular, the present disclosure concerns a method for writing and reading a plurality of data bits to the MRAM cell, comprising the steps of:

heating the magnetic tunnel junction to a high temperature threshold;

applying a write magnetic field having a predetermined magnitude such as to orient the first and second storage magnetization; and cooling the magnetic tunnel junction to the low temperature threshold to freeze the first and second storage magnetizations in their written orientation;

wherein said high temperature threshold comprises one of:

a first high temperature threshold at which the write magnetic field is smaller than a spin-flop field of the storage magnetic layer, such that the first storage magnetization is oriented antiparallel with the second storage magnetization; or a second high temperature threshold at which the write magnetic field is above the spin-flop field of the storage magnetic layer, such that the first storage magnetization forms a predetermined angle below 180° with respect to the second storage magnetization.

The method disclosed herein allows for storing at least three distinct state levels in the MRAM cell. The writing operation can be performed with the MRAM cell comprising only one current line for generating a single magnetic field.

Since the different state levels are written by varying the temperature, a constant magnetic field can be used.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS

Figure 1:
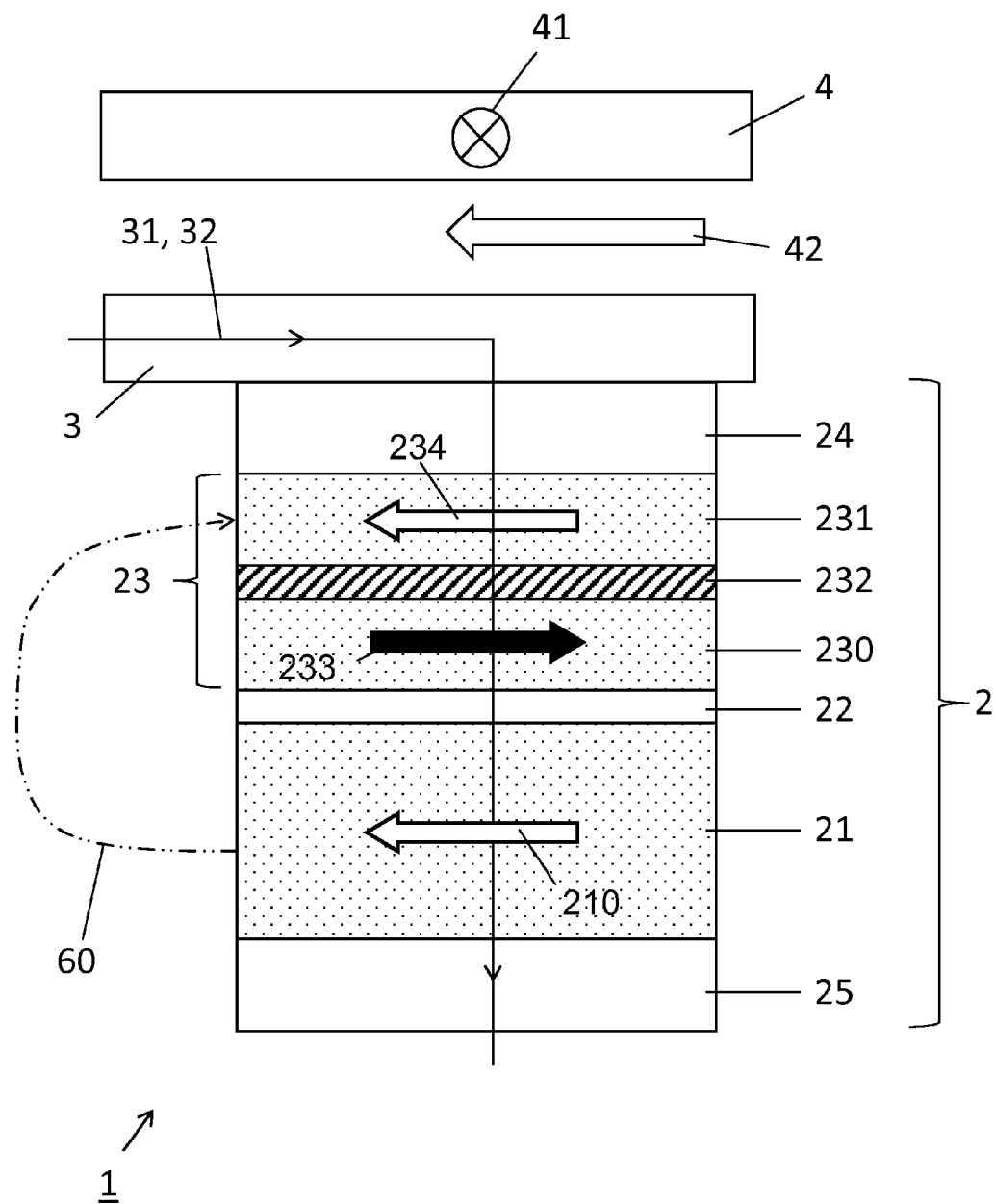
FIG. 1 shows a multibit self-referenced MRAM cell 1 comprising a SAF storage layer comprising a first and second storage magnetization and an antiferromagnetic storage exchange-coupling the storage layer such as to pin one of the first and second storage magnetization at a low temperature threshold and free it at a high temperature threshold, according to an embodiment.

FIG. 1 shows a multibit MRAM cell 1 according to an embodiment. The MRAM cell 1 comprises a magnetic tunnel junction 2 including a reference layer 21, a storage layer 23, and a tunnel barrier layer 22 included between the storage layer 23 and the reference layer 21. The storage layer 23 is represented by a synthetic storage layer, or synthetic antiferromagnet (SAF), comprising a first storage ferromagnetic layer 230 having a first storage magnetization 233, and a second storage ferromagnetic layer 231 having a second storage magnetization 234. A storage anti-parallel coupling layer 232 is included between the first and second storage ferromagnetic layer 231, 232. The storage coupling layer 232 produces a RKKY coupling between the first and second storage layers 230, 231 such that the second storage magnetization 234 remains antiparallel to the first storage magnetization 233. The two storage ferromagnetic layers 230, 231 can comprise a CoFe, CoFeB or NiFe alloy and have a thickness typically comprised between about 0.5 nm and about 4 nm. The storage coupling layer 232 can comprise a non-magnetic material selected from a group comprising at least one of: ruthenium, chromium, rhenium, iridium, rhodium, silver, copper and yttrium. Preferably, the storage coupling layer 232 comprises ruthenium and has a thickness typically included between about 0.4 nm and 2 nm, preferably between 0.6 nm and about 0.9 nm or between about 1.6 nm and about 2 nm.

The magnetic tunnel junction 2 further comprises an antiferromagnetic storage layer 24 adapted to exchange-couple the SAF storage layer 23 such as to pin, at a low temperature threshold, the storage magnetization 233, 234 of the one of the storage layers 230, 231 being adjacent to the antiferromagnetic storage layer 24. In the example of FIG. 1, the antiferromagnetic storage layer 24 is adjacent to the second storage layer 234, on the side of the storage layer 23 being opposed to the tunnel barrier layer 22. Here, adjacent means that said one of the storage layers 230, 231 may or may not be in actual contact with the antiferromagnetic storage layer 24, but is not separated from the antiferromagnetic storage layer 24 by the other storage layer 231, 230. In the example of FIG. 1, the second storage layer 231 is adjacent to the antiferromagnetic storage layer 24 and the first storage layer 230 is not. At a high temperature threshold, the storage magnetization 233, 234 is no longer pinned by the antiferromagnetic storage layer 24 and can be freely adjusted. The antiferromagnetic storage layer 24 can comprise a manganese-based alloy, such as IrMn or FeMn or a combination of any of manganese-based alloys, preferably arranged in a multi-layered structure, or any other suitable materials. The high temperature threshold is typically at or above a temperature of about 150° C. In the configuration of the magnetic tunnel junction shown in FIG. 1, the second storage layer 231 is adjacent to the antiferromagnetic storage layer 24.

The reference layer 21 has a reference magnetization 210 that can be freely adjusted. Alternatively, the reference magnetization 210 is fixed relative to the first and second storage magnetizations 233, 234. In the latter configuration, the magnetic tunnel junction 2 can further comprise an antiferromagnetic read layer 25 pinning the reference magnetization 210, such that the reference magnetization 210 of the reference layer 21 is fixed relative to the first and second storage magnetization 233, 234 at the low and high temperature threshold. The antiferromagnetic read layer 25 is preferably disposed adjacent to the reference layer 21 on its side opposed to the tunnel barrier layer 22. The antiferromagnetic read layer 25 preferably comprises a Mn based alloy, for example, comprising one of PtMn, NiMn, IrMn and FeMn. In the case of a self-referenced MRAM cell 1, the reference magnetization 210 is freely adjustable and the magnetic tunnel junction 2 does not include the antiferromagnetic read layer 25. The reference layer 21 is then usually called sense layer.

The tunnel barrier layer 22 can be an insulating layer, for example, comprising an oxide selected in the group including among others aluminum oxides $Al_2O_3$ and magnesium oxides MgO.

A method for writing and reading the MRAM cell 1 can comprises the steps of, during the writing operation:

heating the magnetic tunnel junction 2 to the high temperature threshold;

applying a write magnetic field 42 having a predetermined magnitude $H_{42}$ such as to orient the first and second storage magnetization 233, 234; and cooling the magnetic tunnel junction 2 to the low temperature threshold to freeze the first and second storage magnetizations 233, 234 in their written orientation.

The MRAM cell 1 further comprises a current line 3 electrically connected at one end of the magnetic tunnel junction 2 and a select transistor (not represented in FIG. 1) electrically connected at the other end of the magnetic tunnel junction 2. In such configuration, heating the magnetic tunnel junction 2 can be performed by passing a heating current pulse 31 in the magnetic tunnel junction 2 via the current line 3 when the select transistor is in a passing mode.

In the example of FIG. 1, the MRAM cell 1 further comprises a field line 4 adapted to pass a field current 41 such as to generate the write magnetic field 42. Alternatively, the field current 41 can be passed in the current line 3. In the latter configuration, the MRAM cell 1 does not require the additional field line 4. In particular, once the magnetic tunnel junction 2 has reached the high temperature threshold, the orientation of the first storage magnetization 233 and of the second storage magnetization 234 depends on the high temperature threshold.

In another embodiment, the reference magnetization 210 is freely adjustable and the write magnetic field 42 is applied with a magnitude such as to saturate the reference magnetization 210 in a direction according to the direction of the write magnetic field 42. The saturated reference layer 21 induces in turn a local reference magnetic stray field 60 adapted for orienting the second storage magnetization 234 (or first storage magnetization 233) in accordance with the stray field orientation, once the magnetic tunnel junction 2 has reached the high temperature threshold. Both layers 233, 234 remain coupled antiparallel by the storage coupling layer 232. Due to the small distance between the storage layer 23 and the reference layer 21 (typically in the nanometer range), the magnitude of the stray field capable of orienting the storage magnetizations 233, 234 can be small. The magnitude of the write magnetic field used for saturating the reference magnetization 210 can be smaller than the magnitude used for directly writing the storage magnetization 233, 234. The above arrangement of the MRAM cell 1 and the variant of the method for writing can be called: self-referenced thermally-assisted MRAM with dipolar writing.

Figure 2:
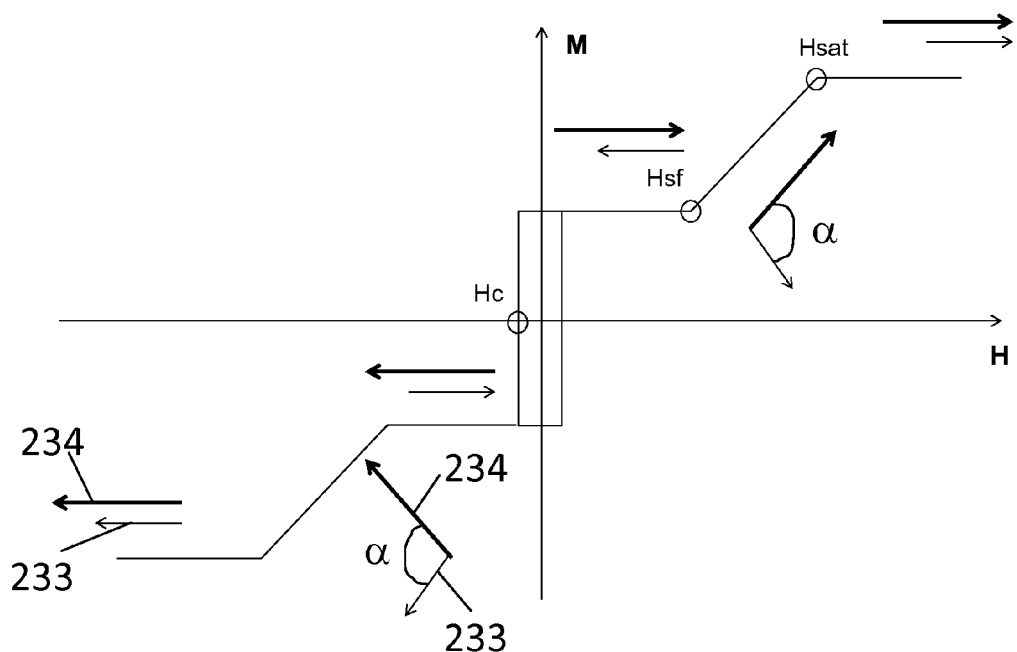
FIG. 2 represents a magnetization curve of the non exchange-coupled SAF storage layer.

FIG. 2 represents a magnetization curve of the SAF storage layer 23 comprising the first and second storage ferromagnetic layer 230, 231 for the case where the write magnetic field 42 is applied substantially parallel to an anisotropy axis of the storage layer 23 and for the case the magnetic tunnel junction 2 is at the high temperature threshold wherein the first and second storage magnetizations 233, 234 are not pinned. Symbol H denote the magnitude of the write magnetic field 42 and symbol M denotes the magnetization values of the first and second storage magnetization 233, 234. The magnetization curve shows a hysteresis loop having a coercive field FL and a spin-flop field $H_{sf}$. Between the coercive field FL and the spin-flop field $H_{sf}$ the first storage magnetization 233 is oriented antiparallel to the second storage magnetization 234. When the magnitude of the write magnetic field 42 is increased above the spin-flop field $H_{SF}$, the first storage magnetization 233 is no more oriented antiparallel with the second storage magnetization but rather forms a predetermined angle α with the second storage magnetization. When the magnitude of the write magnetic field 42 is further increased up to a saturation field $H_{sat}$, the first storage magnetization 233 becomes oriented substantially parallel to the second storage magnetization 234.

Figure 3:
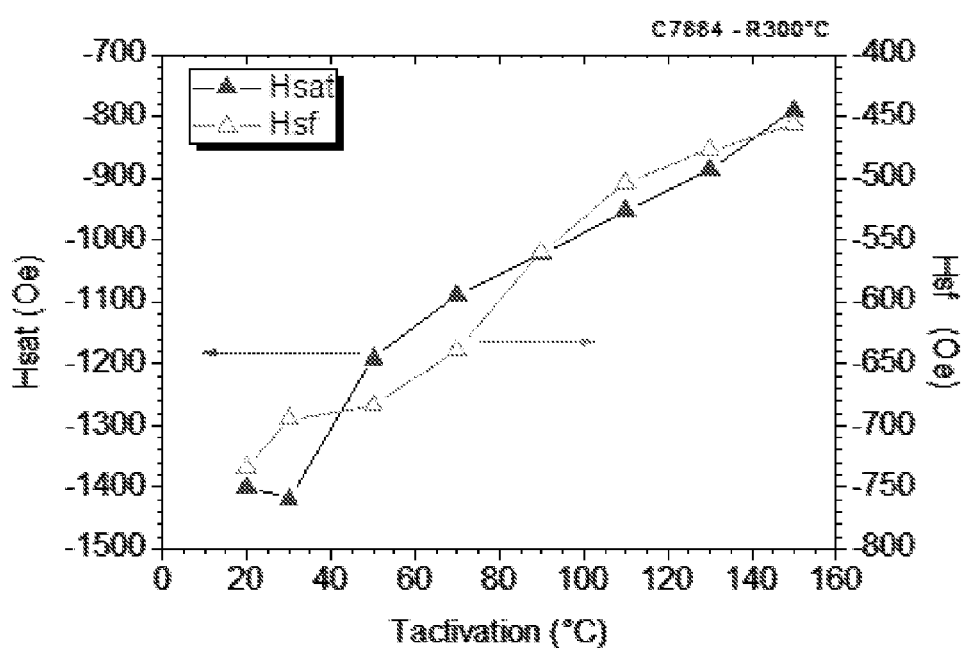
FIG. 3 shows a graph reporting the spin flop field and the saturation field as a function of the temperature of the magnetic tunnel junction, according to an embodiment.

FIG. 3 shows a graph reporting the spin flop field $H_{sf}$ and the saturation field $H_{sat}$ as a function of the temperature of the magnetic tunnel junction 2. As can be seen, both the spin flop field $H_{sf}$ and the saturation field $H_{sat}$ decrease with the magnetic tunnel junction temperature, due to the decrease of the RKKY coupling of the storage coupling layer 232 with the temperature.

Figure 4:
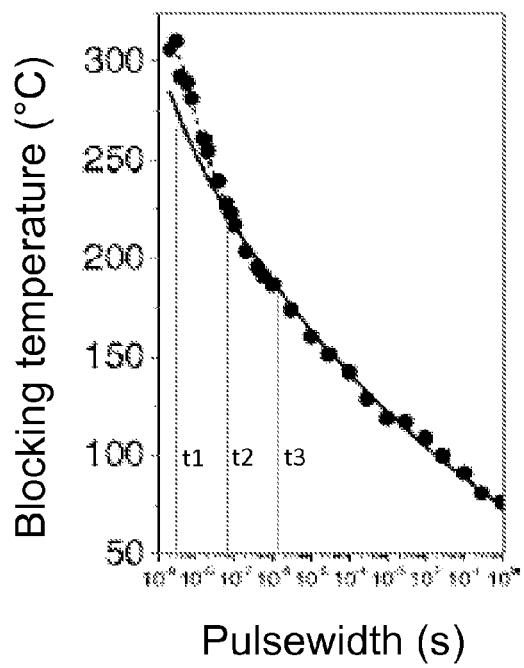
FIG. 4 shows a graph reporting the time dependence of a blocking temperature of the antiferromagnetic storage, according to an embodiment.

FIG. 4 shows a graph reporting the time dependence of a blocking temperature of the antiferromagnetic storage layer 24, according to an embodiment. The blocking temperature is the temperature at and below which the antiferromagnetic storage layer 24 pins one of the first and second storage magnetization 233, 234. The low temperature threshold is thus at or below the blocking temperature and the high temperature threshold is above the blocking temperature. In FIG. 4, it can be seen that the blocking temperature decreases with increasing the pulse width of the heating current pulse 31. In other words, using the heating current pulse 31 having a large pulse width not only increases the temperature of the magnetic tunnel junction 2 compared to using a heating current pulse 31 having a small pulse width but also decreases the blocking temperature of the antiferromagnetic storage layer 24, thus facilitates further arriving at conditions where the storage magnetization 233, 234 is no more pinned.

Figures 8A, 8B, 8C, 8D:
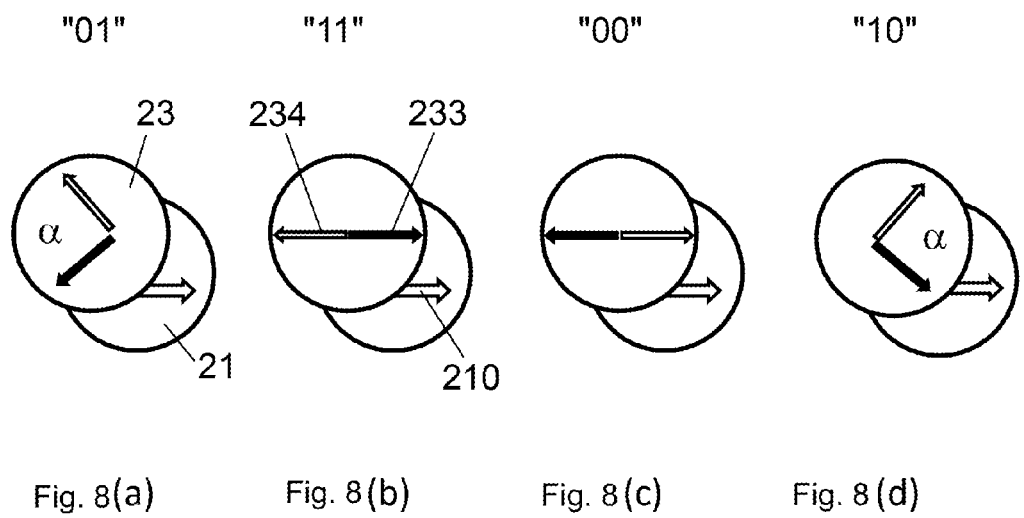
FIG. 8 a to d illustrates arrangements of the first and second storage magnetization at the high temperature threshold, according to an embodiment.
Figures 9A, 9B, 9C, 9D:
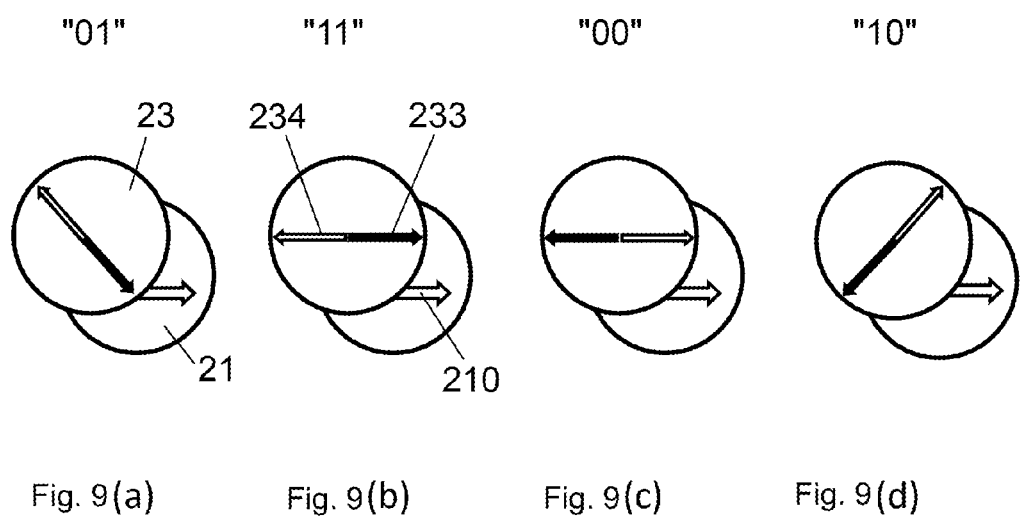
FIG. 9 a to d illustrates arrangements of the first and second storage magnetization at the low temperature threshold, according to another embodiment.

FIG. 8 a to d illustrates arrangements of the first and second storage magnetization 233, 234 when the write magnetic field 42 is applied along the anisotropy axis, and the magnetic tunnel junction 2 is heated at the predetermined high temperature threshold. In the figure, the read layer 21 is also represented by the offset circle with the corresponding read magnetization 210. In FIG. 8, it is assumed that the second storage magnetization 234 has a greater magnitude and is thus oriented with the write magnetic field 42, while the first storage magnetization 233 is oriented due to the coupling effect of the coupling layer 232. FIGS. 9a to 9d represents the orientation of the first and second storage magnetization 233, 234 after cooling the magnetic tunnel junction 2 to the low temperature threshold. FIG. 9 a to d illustrates arrangements of the first and second storage magnetization 233, 234 after cooling the magnetic tunnel junction 2 to the low temperature threshold and in the absence of the write magnetic field 42.

Figure 5:
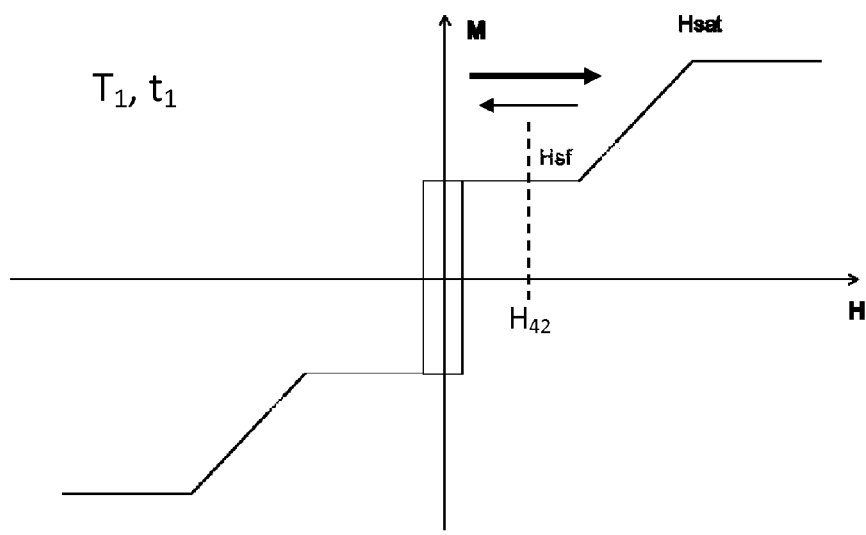
FIG. 5 shows the magnetization curve of FIG. 2 when the magnetic tunnel junction is heated at a first high temperature threshold, according to an embodiment.

In an embodiment, the high temperature threshold comprises a first high temperature threshold $T_1$ such that the applied write magnetic field 42 is between the coercive field $H_c$ and the spin-flop field $H_{sf}$ of the SAF storage magnetic layer 23 (see FIG. 5). Heating the magnetic tunnel junction 2 at the first high temperature threshold $T_1$ can be achieved by passing the heating current 31 having a first pulse width $(t_1)$. In this condition, the second storage magnetization 234 is oriented with the write magnetic field 42, parallel or antiparallel to the reference magnetization 210 depending on the direction of the write magnetic field 42. FIGS. 1, 8b and 9b show the case where the write magnetic field 42 is oriented antiparallel to the reference magnetization 210, while FIGS. 8c and 9c show the case where the write magnetic field 42 is oriented parallel to the reference magnetization 210. After cooling the magnetic tunnel junction 2 and in the presence of the write magnetic field 42, the second storage magnetization 234 in contact with the antiferromagnetic storage layer 24 remains frozen in its written orientation and the first storage magnetization 233 is oriented antiparallel to the second storage magnetization 234 due to the RKKY coupling of the storage coupling layer 232 (FIGS. 9 b and c). The configuration of FIG. 9b corresponds to a high magnetoresistance of the tunnel magnetic junction 2 and to a state level, for example a first state level indicated by the numeral "11", while the configuration of FIG. 9c corresponds to a low magnetoresistance of the tunnel magnetic junction 2 and to a second state level indicated by the numeral "00".

Figure 6:
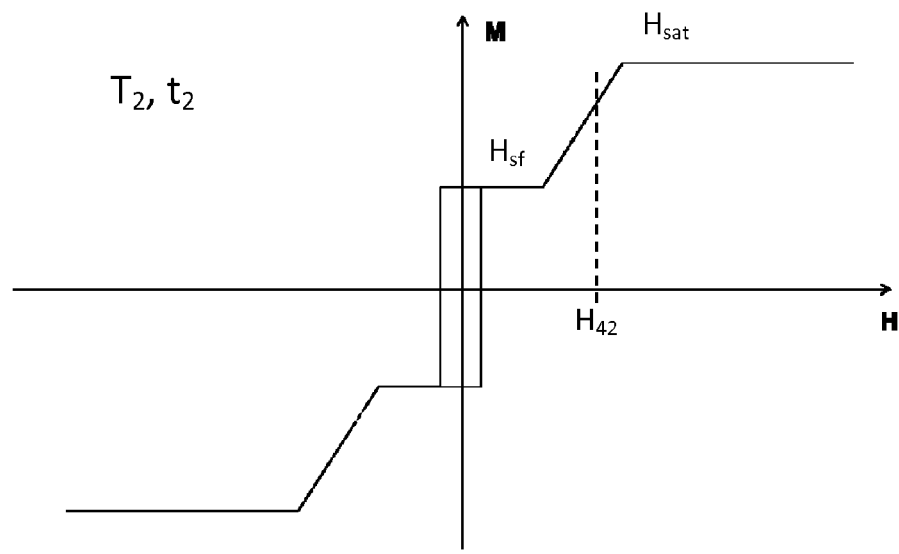
FIG. 6 shows the magnetization curve of FIG. 2 when the magnetic tunnel junction is heated at a second high temperature threshold, according to an embodiment.

Alternatively, the high temperature threshold can comprise a second high temperature threshold $T_2$, higher than the first high temperature threshold $T_1$, such that the applied write magnetic field 42 is above the spin-flop field $H_{sf}$ of the storage magnetic layer 23 and below the saturation field $H_{sat}$. Heating the magnetic tunnel junction 2 at the second high temperature threshold $T_2$ can be achieved by passing the heating current 31 having a second pulse width $(t_2)$ being larger than the first pulse width $(t_1)$. The magnitude $H_{42}$ of the write magnetic field 42 is represented in FIG. 6 as being in the linear portion of the magnetization curve of FIG. 2, above the spin-flop field $H_{sf}$ and below the saturation field $H_{sat}$. In these conditions, the first and second storage magnetizations 233, 234 are oriented with the write magnetic field 42 such that they make a predetermined angle α between each other that is below 180° during the write operation (see FIGS. 8 a and d). The angle α increases with increasing the second high temperature threshold $T_2$ since the magnitude $H_{42}$ of the write magnetic field 42 becomes closer to the saturation field $H_{sat}$.

After the magnetic tunnel junction 2 has been cooled to the low temperature threshold and in the absence of the write magnetic field 42, the orientation of the second storage magnetization 234 is frozen in its written orientation while the first storage magnetization 233 becomes oriented antiparallel with the second storage magnetization 234 (see FIG. 9 a to d). In the case the write magnetic field 42 is oriented antiparallel to the reference magnetization the first storage magnetization 233 makes an angle α/2 with respect to the reference magnetization 210 (FIG. 9a). This arrangement of the first storage magnetization 233 relative to the reference magnetization 210 corresponds to an intermediate value of the magnetoresistance of the tunnel magnetic junction 2 and to a third state level indicated by the numeral "01" in FIG. 9a. In the case the write magnetic field 42 is oriented parallel to the reference magnetization 210 (as shown in FIG. 1) the first storage magnetization 233 makes 180°−α/2 with respect to the reference magnetization 210 (FIG. 9d). This arrangement of the first storage magnetization 233 relative to the reference magnetization 210 corresponds to another intermediate value of the magnetoresistance of the tunnel magnetic junction 2 and to a fourth state level indicated by the numeral "10" in FIG. 9d.

Figure 7:
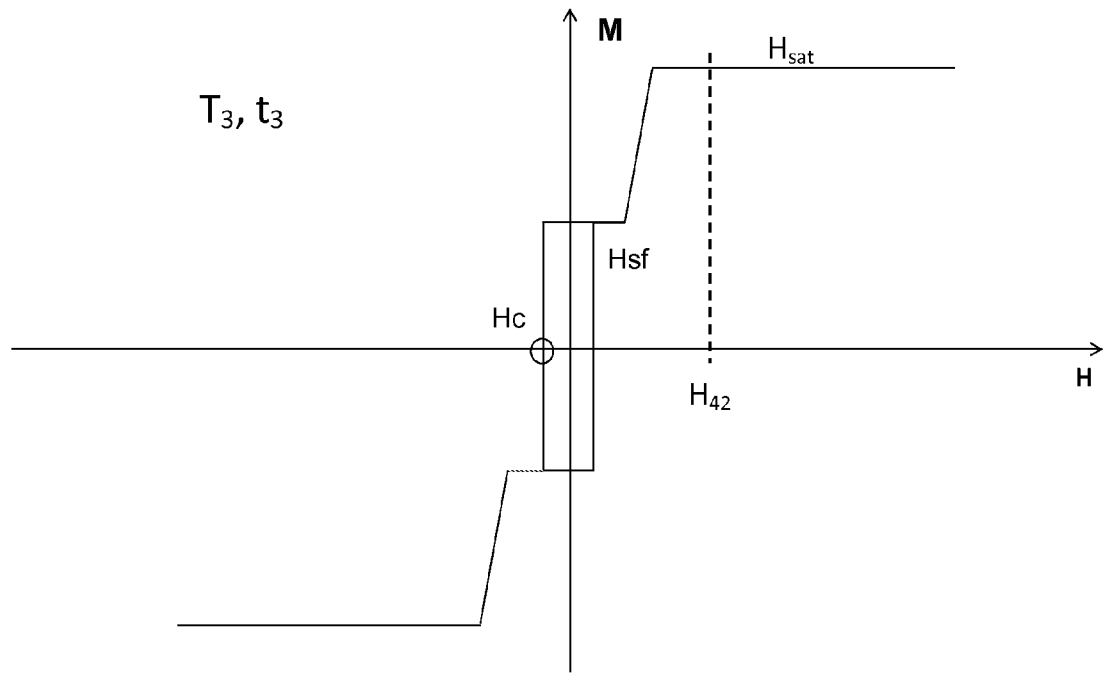
FIG. 7 shows the magnetization curve of FIG. 2 when the magnetic tunnel junction is heated at a third high temperature threshold, according to an embodiment.

In another variant shown in FIG. 7, the high temperature threshold can comprise a third high temperature threshold $T_3$, higher than the second high temperature threshold $T_2$, such that the applied write magnetic field 42 reaches the saturation field $H_{sat}$ of the storage magnetic layer 23 and the first storage magnetization 233 becomes oriented parallel with the second storage magnetization 234. Heating the magnetic tunnel junction 2 at the third high temperature threshold $T_3$ can be achieved by passing the heating current 31 having a third pulse width ($t_3$) being larger than the second pulse width ($t_2$). After cooling the magnetic tunnel junction 2 and in the absence of the write magnetic field 42, the second storage magnetization 234 remains oriented in its written direction and the first storage magnetization 233 becomes antiparallel to the second storage magnetization 234 due to the coupling layer 232. In the case the write magnetic field 42 is oriented parallel with the reference magnetization 210, the magnetoresistance of the tunnel magnetic junction 2 is low, corresponding to the first state level "00". In the case the write magnetic field 42 is oriented antiparallel with the reference magnetization 210, the magnetoresistance of the tunnel magnetic junction 2 is high, corresponding to the second state level "11".

The method for writing and reading the MRAM cell 1 can further comprise, during a read operation, passing a read current 32 in the magnetic tunnel junction 2 via the current line 3, for example by setting the selection transistor in the saturated mode, such as to measure a junction resistance $R_{MTJ}$ of the magnetic tunnel junction 2. The resistance state can be determined by comparing the measured junction resistance ($R_{MTJ}$) with a reference resistance measured for a reference MRAM cell (not represented).

In the case the reference magnetization is freely adjustable, the (self-referenced) read operation can comprise the steps of, in a first read cycle:

passing a first read field current having a first polarity in the first current line 3 such as to induce a first read magnetic field capable of aligning the reference magnetization 210 in a first direction according to the first polarity of the first read field current; and comparing the first aligned magnetization direction with the written state level by passing the read current 32 in the magnetic tunnel junction 2 such as to measure a first junction resistance $R_{MTJ,1}$ of the magnetic tunnel junction 2.

The self-referenced read operation further comprises, in a second read cycle:

passing a second read field current having a second polarity in the first current line 3 such as to induce a second read magnetic field capable of aligning the reference magnetization 210 in a second direction according to the second polarity of the second read field current; and comparing the second aligned magnetization direction with the written state level by passing the read current 32 in the magnetic tunnel junction 2 such as to measure a second junction resistance $R_{MTJ,2}$ of the magnetic tunnel junction 2.

The written state level can then be determined by the difference between the first and second resistance value $R_{MTJ,1}$, $R_{MTJ,2}$.

In another embodiment not represented, the first read current has an alternating polarity and induces an alternating first read magnetic field aligning the read magnetization 210 alternatively, in accordance to the alternating polarity of the first read current. Preferably, the alternating first read current aligns alternatively the read magnetization 210 without switching completely its magnetization. Consequently, the measured first resistance value $R_1$ varies alternatively with the varying read magnetization 210 and the written state level can be determined by comparing the varying first resistance value $R_1$ with the alternating first read current.

REFERENCE NUMBERS

1 MRAM cell
2 magnetic tunnel junction
21 reference magnetic layer
210 reference magnetization
22 tunnel barrier layer
23 storage magnetic layer
230 first storage layer
231 second storage layer
232 storage coupling layer
233 first storage magnetization
234 second storage magnetization
24 antiferromagnetic storage layer
3 current line
31 heating current pulse
32 read current
4 field line
41 field current
42 write magnetic field
60 local reference magnetic stray field
- angle
$H_{42}$ magnitude of the write magnetic field
$H_c$ coercive field
$H_{sat}$ saturation field
$H_{sf}$ spin-flop field
$R_{MTJ}$ junction resistance
$R_{MTJ,1}$ first junction resistance
$R_{MTJ,2}$ second junction resistance
$t_1$ first heating current pulse width
$t_2$ second heating current pulse width
$t_3$ third heating current pulse width
$T_1$ first high temperature threshold
$T_2$ second high temperature threshold
$T_3$ third high temperature threshold

The invention claimed is:

1. Method for writing a plurality of data bits to a magnetic random access memory (MRAM) cell comprising a magnetic tunnel junction comprising a reference magnetic layer having a reference magnetization, a tunnel barrier layer, and a storage magnetic layer including a first storage layer having a first storage magnetization, a second storage layer having a second storage magnetization, a storage coupling layer magnetically coupling the first storage magnetization antiparallel with the second storage magnetization, and an antiferromagnetic storage layer, one of the first storage magnetization and the second storage magnetization being adjacent to the antiferromagnetic storage layer, the antiferromagnetic storage layer pinning, at a low temperature threshold, the one of the first storage magnetization and the second storage magnetization adjacent to the antiferromagnetic storage layer and freeing, at a high temperature threshold, said one of the first storage magnetization and the second storage magnetization adjacent to the antiferromagnetic storage layer, the method comprising:

heating the magnetic tunnel junction to the high temperature threshold;

applying a write magnetic field having a predetermined magnitude to orient the first and second storage magnetization;

cooling the magnetic tunnel junction to the low temperature threshold to freeze the first and second storage magnetizations in their written orientation;

storing a first memory state ('11') in the storage magnetic layer wherein the first storage magnetization is oriented in a first direction by applying a first or a third high temperature threshold and having the write magnetic field in a second direction;

storing a second memory state ('00') in the storage magnetic layer wherein the first storage magnetization is oriented in said second direction by applying the first or the third high temperature threshold and having the write magnetic field in said first direction;

storing a third memory state ('01') in the storage magnetic layer wherein the first storage magnetization makes an angle of α/2 with the second direction by applying a second high temperature threshold and having the write magnetic field in said first direction; and storing a fourth memory state ('10') in the storage magnetic layer wherein the first storage magnetization makes an angle of 180°−α/2 with the second direction by applying the second high temperature threshold and having the write magnetic field in said second direction, wherein:

the write magnetic field is along the anisotropy axis of the storage layer in the first or second direction, said second direction being opposite to the first direction;

at said first high temperature threshold the write magnetic field is between a coercive field and a spin-flop field of the storage magnetic layer, such that the first storage magnetization is oriented antiparallel to the second storage magnetization;

at said second high temperature threshold the write magnetic field is above the spin-flop field of the storage magnetic layer, such that the first storage magnetization forms a predetermined angle α below 180° with respect to the second storage magnetization; and at said third high temperature threshold the write magnetic field is above a saturation field of the storage magnetic layer, such that the first storage magnetization is oriented parallel to the second storage magnetization.

2. The method according to claim 1, wherein said heating the magnetic tunnel junction includes passing a heating current in the magnetic tunnel junction; the heating current having a first pulse width for heating the magnetic tunnel junction at the first high temperature threshold, a second pulse width for heating the magnetic tunnel junction at the second high temperature threshold, and a third pulse width for heating the magnetic tunnel junction at the third high temperature threshold.

3. The method according to claim 2, wherein the MRAM cell further comprises a current line electrically connected at one end of the magnetic tunnel junction and a select transistor electrically connected at the other end of the magnetic tunnel junction such that the heating current passes in the magnetic tunnel junction when the select transistor is in a passing mode.

4. The method according to claim 3, wherein said applying a write magnetic field comprises passing a field current in the current line.

5. The method according to claim 1, wherein the MRAM cell further comprises a field line and wherein said applying a write magnetic field comprises passing a field current in the field line.

6. The method according to claim 1, wherein said applying a write magnetic field is performed substantially parallel to an anisotropy axis of the first and second storage magnetization.

7. The method according to claim 1, wherein the orientation of said reference magnetization is fixed relative to the first and second storage magnetization; the method further comprising passing a read current in the magnetic tunnel junction to measure a junction resistance of the magnetic tunnel junction.

8. The method according to claim 1, wherein the orientation of said reference magnetization can be freely varied.

9. The method according to claim 8, wherein said applying a write magnetic field comprises saturating the reference magnetization in a direction according to the direction of the write magnetic field the first and second storage magnetization being oriented according to a local reference magnetic stray field induced by the saturated reference magnetization.

10. The method according to claim 8, further comprising aligning the reference magnetization in a first aligned direction such as to measure a first junction resistance of the magnetic tunnel junction; aligning the reference magnetization in a second aligned direction such as to measure a second junction resistance of the magnetic tunnel junction; and determining a difference between the first and second junction resistance.

* * * * *

UNITED STATES PATENT AND TRADEMARK OFFICE
CERTIFICATE OF CORRECTION

PATENT NO. : 9,754,653 B2  
APPLICATION NO. : 14/438365  
DATED : September 5, 2017  
INVENTOR(S) : Ioan Lucian Prejbeanu It is certified that error appears in the above-identified patent and that said Letters Patent is hereby corrected as shown below:

In the Specification

Column 5, Line 18: Please delete "“FL”" and replace it with -- "$H_c$" --

Column 5, Line 19: Please delete "“FL”" and replace it with -- "$H_c$" --

Signed and Sealed this
Twelfth Day of December, 2017

Joseph Matal
*Performing the Functions and Duties of the*
*Under Secretary of Commerce for Intellectual Property and*
*Director of the United States Patent and Trademark Office*